United States Patent [19]
Rezzi et al.

[11] Patent Number: 5,696,457
[45] Date of Patent: Dec. 9, 1997

[54] METHOD FOR ERASING A COMMON MODE CURRENT SIGNAL AND TRANSCONDUCTOR ASSEMBLY USING SUCH METHOD

[75] Inventors: Francesco Rezzi, Pavia; Andrea Baschirotto, Tortona; Rinaldo Castello, Arcore, all of Italy

[73] Assignee: SGS-Thomson Microelectronics, S.r.l., Agrate Brianza, Italy

[21] Appl. No.: 454,649

[22] Filed: May 31, 1995

[30] Foreign Application Priority Data

Jun. 30, 1994 [EP] European Pat. Off. ............ 94830323

[51] Int. Cl.$^6$ ................................................ H03K 5/22
[52] U.S. Cl. ................................................ 327/65; 327/66
[58] Field of Search ............................ 327/63, 65, 66, 327/67, 103, 560–563; 330/252, 258

[56] References Cited

U.S. PATENT DOCUMENTS

| | | | |
|---|---|---|---|
| 4,213,098 | 7/1980 | Tsividis | 330/258 |
| 4,267,517 | 5/1981 | Iida et al. | 330/253 |
| 4,618,833 | 10/1986 | Russell | 330/255 |
| 4,874,969 | 10/1989 | Meadows | 327/73 |
| 4,901,031 | 2/1990 | Kalthoff et al. | 330/253 |
| 5,032,797 | 7/1991 | Mijuskovic | 330/258 |
| 5,371,474 | 12/1994 | Wassenaar et al. | 330/253 |

FOREIGN PATENT DOCUMENTS

| | | |
|---|---|---|
| 0228843 | 7/1987 | European Pat. Off. . |
| 2010038 | 6/1979 | United Kingdom . |

*Primary Examiner*—Toan Tran
*Attorney, Agent, or Firm*—Robert Groover; Betty Formby; Matthew Anderson

[57] ABSTRACT

A low-voltage transconductor circuit in which the common mode gain of a first transconductor stage is compensated by a second transconductor stage (connected in parallel with the first transconductor stage) which has no differential mode transconductance, and which is connected so that its common mode transconductance offsets the common mode transconductance of the stage. This greatly reduces the common mode current signal at the output, while avoiding the necessity for a current sink at the source of the input transistors.

14 Claims, 2 Drawing Sheets

METHOD FOR ERASING A COMMON MODE CURRENT SIGNAL AND TRANSCONDUCTOR ASSEMBLY USING SUCH METHOD

DESCRIPTION

The present invention relates to a method for cancelling a common mode current signal in the output of a transconductor circuit and to a transconductor circuit in which the common mode current signal is substantially cancelled.

Differential circuits are rather widespread and well known is also the problem of common mode signals, in general undesired.

Figure 1:
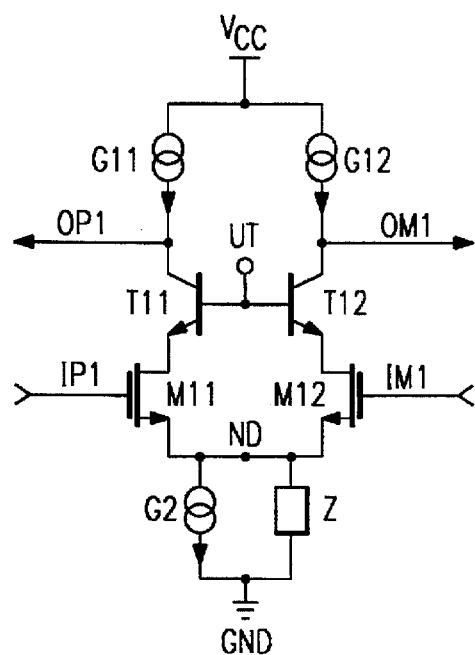

A known example of a differential transconductor having differential inputs and outputs is shown in FIG. 1. It consists of a structure exhibiting two symmetrical branches both connected on one side to a terminal VCC having a fixed reference potential (usually the power supply positive) and on the other to a common node ND. The common node ND is connected to another terminal GND having fixed reference potential (often ground or the poser supply negative) through a current generator. In FIG. 1 said current generator is represented by means of its equivalent parallel circuit consisting of the parallel connection of an ideal current generator G and an output impedance Z of the current generator.

One branch consists of the series connection of a current generator G11, a BJT transistor T11 and a MOS transistor M11 and the other of a generator G12, a BJT T12 and a MOS M12. The bases of the BJTs T11 and T12 are connected together with a terminal UT having fixed polarisation potential. The control gates of the MOS transistors M11 and M12 are connected respectively to a first input IP1 and a second input IM1. A first output OP1 is connected to the collector of the BJT transistor T11 and a second output OM1 is connected to the collector of the BJT T12.

Such a circuit exhibits a good common mode rejection relationship especially at low frequency but a certain voltage drop on the current generator G2 which constitutes a problem for circuits operating at low supply voltage (3V, for example).

For this reason structures have been proposed and are referred to below as "pseudo-differential", quite similar to the "full differential" ones such as that illustrated above but in which the terminal ND is directly connected to the fixed potential terminal GND like that illustrated in FIG. 2 and described in patent application GB-A-2 175 763.

Figure 2:
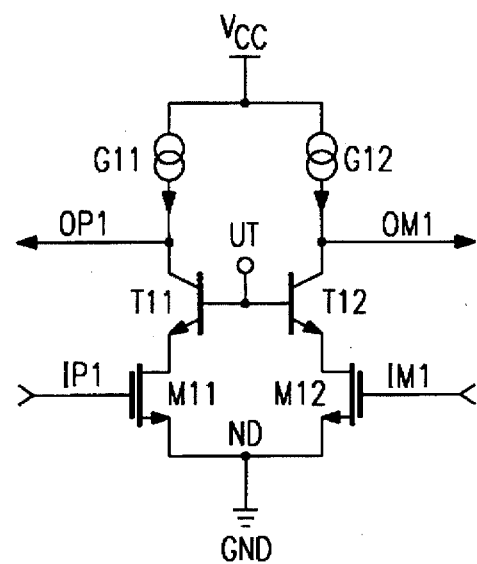

Said structures solve the problems linked to low supply voltage but have the serious disadvantage of exhibiting very high common mode gain (equal to the differential mode gain in the circuit of FIG. 2).

The purpose of the present invention is to obviate the disadvantages of the known art.

This purpose is achieved by connecting in parallel to a first transconductor circuit having high common mode transconductance, a second transconductor circuit having common mode transconductance substantially equal in magnitude to that of the first circuit and of opposite sign, the transconductor system thus achieved exhibits substantially null common mode transconductance.

The two circuits can then be advantageously integrated leading to a savings in the number of components and in the area required for integration and improving in addition the performance in accordance with the instructions of the method set forth in claim 5 and the system set forth in claim 10.

Figure 3:
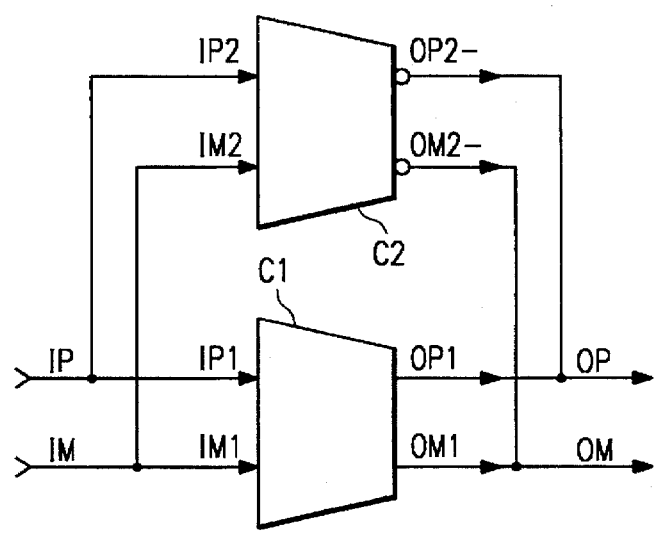
Figure 4:
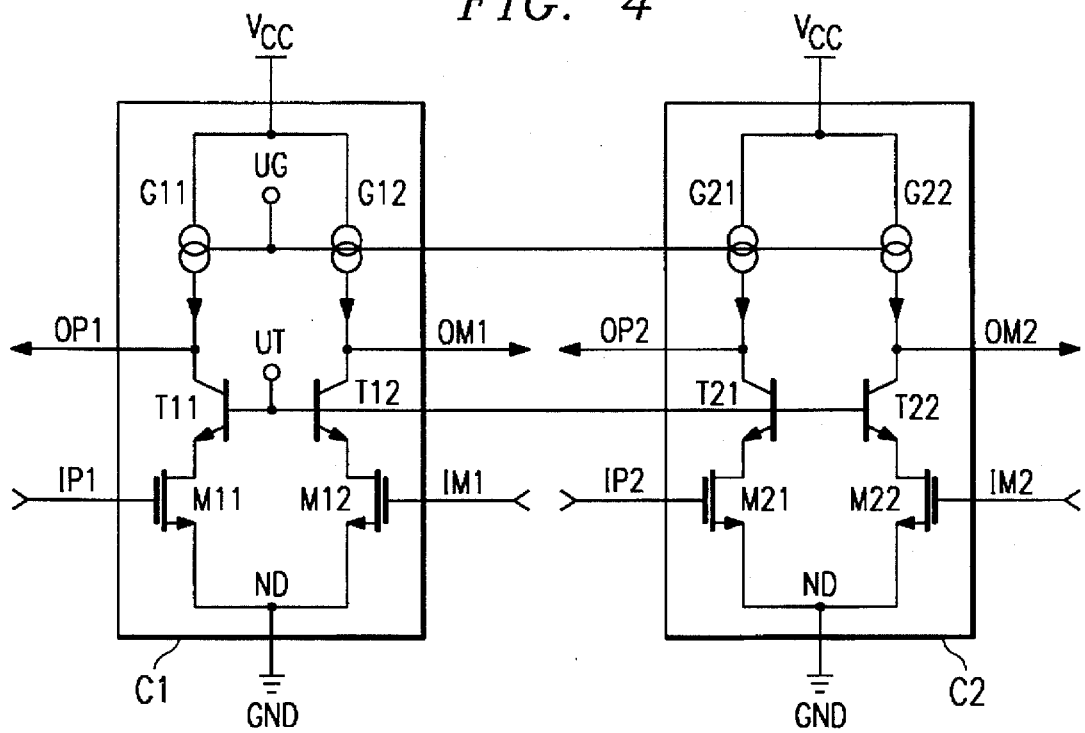
Figure 5:
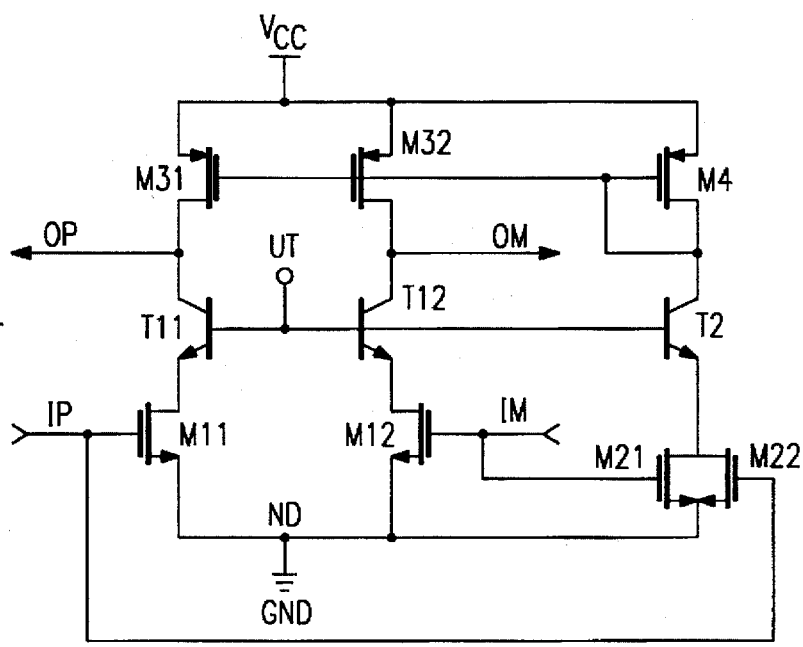

The invention is clarified by the description given below taken together with the annexed drawings wherein:

FIG. 1 shows the circuitry diagram of a transconductor of the "fully differential" type in accordance with the known art, FIG. 2 shows the circuitry diagram of a transconductor of the "pseudo-differential" type in accordance with the known art, FIG. 3 shows a block diagram of a transconductor system in accordance with the present invention, FIG. 4 shows the circuitry diagram of an embodiment of the system of FIG. 3, and FIG. 5 shows the circuitry diagram of another embodiment of a transconductor system in accordance with the present invention.

The system in accordance with the present invention of FIG. 3 has two input terminals IP and IM respectively, and two output terminals, OP and OM respectively. It comprises a first transconductor circuit C1 having two input terminals IP1 and IM1 and two output terminals OP1 and OM1 and a second transconductor circuit C2 also having two input terminals IP2 and IM2 and two output terminals OP2 and OM2. The circuits C1 and C2 are connected in parallel with each other.

By providing the transconductor system C2 in such a manner that it has a common mode transconductance substantially equal in magnitude to that of the first transconductor circuit C1 and of opposite sign, the transconductor system thus achieved has common mode transconductance substantially null.

Naturally the same relationship must not apply simultaneously also between the differential mode transconductances so that the differential mode transconductance of the system is the sum of those of the two circuits C1 and C2 and has a finite value.

FIG. 4 shows an embodiment of the circuits C1 and C2 of FIG. 3 wherein there are not shown for the sake of drawing clarity the connections between the various input and output terminals.

The topology of the first transconductor circuit C1 coincides exactly with that of the circuit of FIG. 2 while that of the transconductor circuit C2 coincides with that of the circuit of FIG. 2 except that the drain terminals of the MOS input transistors are also connected together electrically. This connection causes the common mode transconductance to remain unchanged while the differential mode transconductance becomes substantially null.

The outputs of the two circuits C1 and C2 of FIG. 4 are to be connected through an appropriate circuitry, not explicitly indicated in FIG. 3 nor in FIG. 4, which permits achieving the desired sign inversion of the common mode transconductance, e.g. by means of current mirrors.

The differential mode transconductance of the system of FIG. 3 will coincide substantially then with the differential mode transconductance of the transconductor circuit C1.

These observations on transconductance up to this point do not allow for their variations with frequency. It is natural that they must be satisfied at least in the operating range of the transconductor system.

One branch of the transconductor circuit C2 consists of the series connection of a current generator G21, a BJT transistor T21 and a MOS transistor M21 and the other of a generator G22, a BJT T22 and a MOS M22. The bases of the BJTs T21 and T22 are connected together with the terminal UT having a fixed polarisation potential. The control gates of the MOS transistors M21 and M22 are connected respectively to a first input IP2 and a second input IM2. A first output OP2 is connected to the collector of the BJT transistor T21 and a second output OM2 is connected to the collector of the BJT transistor T22.

In the diagram of FIG. 4 is shown also another terminal UG having another fixed polarisation potential designed to control the current generated by the generators G11, G12, G21, G22.

The potential of the terminal UG is usually chosen in such a manner that, if there were no transconductor circuit C2, by applying to the inputs of the transconductor circuit C1 a common mode voltage equal to that expected at the system input, under normal operating conditions, the current at the system output is null. In this manner the need to cancel the common mode is minimised.

In a perfectly symmetrical structure like that of FIG. 4 the homologous devices must be as nearly identical as possible. In this case the choice of potential of the terminal UG is considerably freer.

The diagram of FIG. 5 constitutes a particularly advantageous embodiment of the present invention.

It consists of a first transconductance circuit identical to transconductor circuit C1 of FIG. 3 in which the generators G11 and G12 were provided by means of two MOS transistors M31 and M32 and a second transconductor circuit similar to the transconductor circuit C2 of FIG. 3 in which the two BJT transistors T21 and T22 have been replaced by a single BJT transistor T2 and in which the two generators G21 and G22 have been replaced by a single MOS transistor M4.

It is important to note that the terminal UG has been connected electrically to the drain terminal of MOS transistor M4. In this manner the MOS transistors M31 and M32 in combination with the MOS transistor M4 form two current mirrors. The current mirrored is that generated by the second transconductor circuit which is sensitive to the common mode voltage at its input. By choosing the area of the MOS transistors M21 and M22 equal to half that of the MOS transistors M11 and M12 there is obtained the weighed sum of the common mode signals at input.

Through the mirror are then activated sign inversion and transfer of the common mode current signal on the output.

As concerns the frequency performance of this circuit, it is limited by the speed of the current mirror. Under ideal conditions of the parameters of the electronic devices and assuming that the mirror introduces a pole, it can be verified that the common mode rejection can be increased at will even beyond the values obtainable with the "fully differential" type circuits provided said pole is sufficiently high, i.e. the mirror is fast.

To speed up the mirror there can be used, instead of the structure of FIG. 5, a "cascode" structure permitting for equal output resistance use of devices with shorter channel and hence faster.

Nothing precludes using the instructions of the present invention even, e.g. for "fully differential" circuits. Furthermore, as an extension of the "pseudo-differential" circuits, they could be applied also to non-differential circuits provided the common mode signal is considered as a "standby" value and the differential mode signal as the difference from said value.

We claim:

1. A method for cancelling a common mode current signal at an output of a first pseudo-differential transconductor circuit having differential mode transconductance equal to a first value and common mode transconductance value equal to a second value and characterized in that in parallel with said first transconductor circuit is placed a second pseudo-differential transconductor circuit having a respective common mode transconductance which is substantially equal in magnitude to said second value and of opposite sign; whereby operation at low supply voltages is possible, and the combination of said first and second circuits provides a differential transconductor output with greatly reduced common-mode gain.

2. A method in accordance with claim 1 in which said second transconductor circuit has differential mode transconductance of substantially null value.

3. A method in accordance with claim 1 in which said first value and said second value are substantially equal.

4. A method in accordance with claim 1 in which said first and said second value depend on frequency and in which the relationships between said transconductances of said transconductor circuits are satisfied in at least one frequency range.

5. A method of cancelling a common mode current signal at an output of a first transconductor circuit having differential mode transconductance equal to a first value and common mode transconductance equal to a second value, wherein, in parallel with said first transconductor circuit, there is placed a second transconductor circuit designed to generate a second current and having differential mode transconductance of substantially null value and common mode transconductance of substantially said second value and in that said second current is used to provide a bias current at the output of said first transconductor circuit; whereby a differential transconductor output is obtained with greatly reduced common-mode gain.

6. A transconductor system comprising:
   a first transconductor circuit having differential mode transconductance equal to a first value and common mode transconductance equal to a second value and
   a second transconductor circuit connected in parallel with said first transconductor circuit and having common mode transconductance substantially equal in magnitude to said second value and of opposite sign.

7. A system in accordance with claim 6 in which said second transconductor circuit has two input transistors having their control terminals connected to the inputs of said second circuit and the remaining terminals connected to each other and is a pseudo-differential type.

8. A system in accordance with claim 7 in which said first transconductor circuit is a pseudo-differential type and is identical to said second transconductor circuit except that only two of said remaining terminals are connected to each other.

9. A system in accordance with claim 8 in which said first and second transconductor circuits are connected respectively to pairs of bias current generators having a fixed value corresponding to a value which determines for said first transconductor circuit a null output current when supplied at its input with a common mode voltage expected, under normal operating conditions, at the input of said system.

10. A transconductor system of the type comprising a first transconductor circuit comprising at least one bias current generator characterised in that it comprises a second transconductor circuit having its input connected to the input of said first circuit, differential mode transconductance of substantially null value and output connected to said generator such that the output current of said first circuit remains null with variation of the common mode voltage at its input.

11. A system in accordance with claim 10 in which said at least one generator comprises at least one current mirror piloted by the output of said second circuit.

12. A system in accordance with claim 10 in which said circuits are the pseudo-differential type and in which said first circuit comprises two equal current generators, one for each branch of the differential.

13. An integrated circuit transconductor stage, comprising:
- a first pseudo-differential transconductor stage, connected to receive a differential input signal and accordingly provide a first current output with a first common mode gain value and a first differential mode gain value;
- a second pseudo-differential transconductor stage, connected to receive said differential input signal and accordingly provide a second current output with a second common mode gain value and a differential mode gain value of approximately zero;
- said first and second outputs being connected together so that said second common mode gain value of said second transconductor stage substantially cancels said first common mode gain value of said first transconductor stage, resulting in a net common mode gain value of approximately zero.

14. An integrated circuit transconductor stage, comprising:
- a first pseudo-differential pair of field-effect transistors, having
  - respective source regions of a first channel conductivity type both directly connected to a first power supply connection,
  - respective gates thereof connected to receive a differential input signal, and
  - respective drains thereof connected to provide a variable current contribution to a differential transconductor output;
- a second pseudo-differential pair of transistors, having
  - respective source regions of a first channel conductivity type both directly connected to a first power supply connection,
  - respective gates thereof connected to receive said differential input signal, and
  - respective drains thereof connected to provide a variable current contribution to a second-conductivity-type drain region of a diode-connected load transistor;
- first and second additional field-effect transistors, each having gates connected to said drain and a gate of said diode-connected load transistor, and each having a drain connected to apply current to a respective one of said first pair of transistors and also to a respective output terminal;
- whereby operation at low supply voltages is possible, and said differential transconductor output is produced at said output terminals and has a greatly reduced common-mode gain.

* * * * *